United States Patent [19]
Eaton et al.

[11] Patent Number: 4,939,694
[45] Date of Patent: Jul. 3, 1990

[54] DEFECT TOLERANT SELF-TESTING SELF-REPAIRING MEMORY SYSTEM

[75] Inventors: Steven G. Eaton, Mt. View; Lawrence R. Hanlon, Menlo Park; Marvin S. Keshner, Mt. View, all of Calif.

[73] Assignee: Hewlett-Packard Company, Palo Alto, Calif.

[21] Appl. No.: 377,787

[22] Filed: Jul. 10, 1989

Related U.S. Application Data

[63] Continuation of Ser. No. 926,620, Nov. 3, 1986, abandoned.

[51] Int. Cl.$^5$ ............................................. G11C 8/00
[52] U.S. Cl. ................................. 365/200; 365/201; 371/8.1; 371/10.2
[58] Field of Search ............... 365/200, 201; 371/8.1, 371/10.2

[56] References Cited

U.S. PATENT DOCUMENTS

| | | | |
|---|---|---|---|
| 4,493,075 | 1/1985 | Anderson et al. | 371/10 |
| 4,707,810 | 11/1987 | Ferrant | 365/200 |

*Primary Examiner*—James W. Moffitt

[57] ABSTRACT

A self-testing and self-repairing memory system is presented as well as a method for using it and a method for making it. This memory system is constructed from memory chips that have passed an abbreviated wafer probe test. After the memory system is assembled, it tests itself to locate defective memory cells. The memory system may decide to correct these defective memory cells or it may decide to correct them using an error correction code engine. This memory system tests itself during field use to locate defective memory cells. Once these defective memory cells are located, the memory system uses the error correction code engine to correct these defective memory cells. When the error correction code engine becomes overburdened with defective memory cells, then the memory system replaces these defective memory cells.

23 Claims, 3 Drawing Sheets

DEFECT TOLERANT SELF-TESTING SELF-REPAIRING MEMORY SYSTEM

This application is a continuation of application Ser. No. 06/926,620, filed 11/3/86, now abandoned.

FIELD OF THE INVENTION

The invention relates to computer semiconductor memories. More particularly, the invention relates to self-testing and self-repairing computer memory systems and a method for making and using them.

BACKGROUND OF THE INVENTION

FIG. 1 shows a prior-art method for testing and constructing dynamic RAM memories. After fabricating the wafers and before cutting them into individual chips the prior art conducts comprehensive wafer probe tests on the entire wafer. One such test is a D.C. fail test. This test measures the power supply current drawn by each die in active mode and standby mode. If a die draws too much current in either mode, the tester discards the die because the tester assumes the die has a short. Other wafer probe tests conducted on the individual cells, address decoders, and sense amplifiers determine their functionality.

After completion of the wafer probe tests, a laser repair procedure replaces defective memory cells with redundant rows and columns. If the number or placement of redundant rows and columns is not sufficient to repair the defective memory cells, the die is discarded. After completion of laser repair, the prior art retests the wafer. All failing die must be discarded because the prior-art procedures have no way to repair them.

After completing tests on the wafer, the wafer is diced into separate chips and assembled into separate packages. These packaged chips are tested for defects and then endure burn-in tests lasting approximately two days at elevated temperatures of 125° C. After passing the burn-in test, the devices encounter the manufacturer's final tests. These time-consuming, expensive tests include a pattern disturb test and write recovery test in addition to other tests. The chip manufacturer ships passing devices to customers who typically conduct the incoming screening tests on a sample of the devices. After installing these devices into memory systems, the customer tests the memory systems. These tests typically include a second burn-in test.

The testing and manufacturing procedures of the prior art have numerous disadvantages. Prior-art procedures use expensive equipment. The prior art handles the chips extensively and exposes them to electrostatic discharge and other hostile conditions that cause failures. Additionally, prior-art procedures inefficiently test for pattern sensitive defects. Pattern sensitive defects are memory defects that cause failures when the bits have a particular configuration. The prior art conducts tests for these pattern sensitive defects by storing every possible combination of ones and zeros into the memory. Obviously, this procedure is very time consuming if not impossible. Therefore, prior-art procedures miss some pattern sensitive defects. These undetected defects will cause system failures when they occur during field use.

Another disadvantage of prior-art testing and manufacturing procedures is the limited repair capability. The laser repair procedure of the prior art can only repair a small number of cell, column, or row defects. Additionally, the prior-art procedure can not repair defects found after the completion of the laser repair. Since the prior art conducts extensive tests after completing the laser repair procedure, this limitation is particularly troublesome.

The disadvantages discussed above increase the cost of manufacturing memory and decrease the yield of usable memory. Additionally, the disadvantages result in costly system failures. The methods and apparatus in accordance with the present invention obviate these problems.

SUMMARY OF THE INVENTION

An objective of the invention is to lower the cost of memory by reducing testing expense, by improving memory yields, and by enabling a memory system to test and repair itself.

The invention is a self-testing and self-repairing memory system, a method of making such a memory system, and a method of using it. This memory system tests and repairs itself during manufacture and during normal operation.

The self-testing self-repairing memory system made according to the present invention includes the following:

(a) memory chips that have passed an abbreviated wafer probe test;

(b) a system controller that coordinates testing and repairing by locating defective memory cells in the memory chips and electing to replace them with replacing them with replacement cells;

(c) a rewritable substitute address table, for storing the location or address of replacement memory cells;

(d) an address interpreter, for obtaining the correct address of the replacement memory cells from the substitute address table; and (e) an error correction code engine (ECC) engine capable of detecting and correcting errors in the memory chips.

According to the present invention, a method for making a self-testing and self-repairing memory system exploits the self-testing and self-repairing capability of the memory system. The method assembles all the parts listed above. After assembly, the system controller conducts an initial self-test on the memory chips to determine the location of defective memory cells. The system controller determines whether to replace the defective memory cells or have the ECC engine correct resulting data errors. Large groups of defective memory cells are typically replaced to avoid overburdening the error correction code engine. The system controller replaces defective memory cells by storing the addresses of the replacement memory cells and the defective memory cells into the substitute address table.

According to the present invention for the method of using the self-testing and self-repairing memory system detects and corrects data errors, and replaces defective memory cells during normal operation. When the system is powered on, the system controller tests the memory system and replaces the larger groups of defective memory cells. When the power-on tests are completed, the error correction code engine begins its constant search for data errors. The ECC engine corrects data errors at newly located defective memory cells, soft errors, and data errors at previously located defective memory cells that the system controller decided not to replace. Meanwhile, the system controller monitors the number of defective memory cells and replaces the larger groups of defective memory cells by storing the addresses of replacement memory cells in the substitute address table.

Memory systems, according to the present invention, have several advantages which result in lower manufacturing cost and greater memory system reliability. First, instead of having expensive external equipment conduct tests on the memory systems, the memory systems, according to the present invention, can test themselves. This lowers testing costs during manufacture.

Second, memory systems, according to the present invention, require fewer tests during their manufacture. A memory system according to the present invention can replace defective memory cells at any time. Therefore, these memory systems delay most testing until the last step in the manufacturing process. Prior-art memory systems are repaired before the chips are passivated. Since this occurs early in the manufacturing process, the prior art must conduct two sets of tests. One set of tests searches for memory defects to repair before the chip is passivated. An additional set of tests must be conducted at the end of the manufacturing process to locate defects that have arisen since the first set of tests.

Third, memory systems, according to the present invention, correct pattern sensitive errors during field use of the memory system. Prior-art memory systems can not correct the pattern sensitive defects during field use. Therefore, the prior-art memory systems must conduct extensive tests to locate these elusive defects. Tests for pattern sensitive defects are expensive and increase the cost of memory systems.

Fourth, memory systems, according to the present invention can detect and replace its defective memory cells at any time. This advantage permits memory systems to use memory chips that have a few defective memory cells. In contrast, if a prior-art memory system has any defects after the laser repair step, that memory system must be discarded. This decreases the yields of prior art memory systems. Furthermore, if a prior-art memory system obtains a defect during field use, this defect will cause a system failure.

Finally, memory systems, according to the present invention, have increased reliability. Unlike the prior-art memory systems, they can recover from both hard and soft errors that occur during normal operation. In addition, it can detect the occurrence of new defects and determine the rate at which they occur. Based on this information, the memory system controller estimates future reliability of the memory system and reports this information to the host computer. If necessary, the system controller can request a service call.

SYSTEM OVERVIEW

Figure 3:
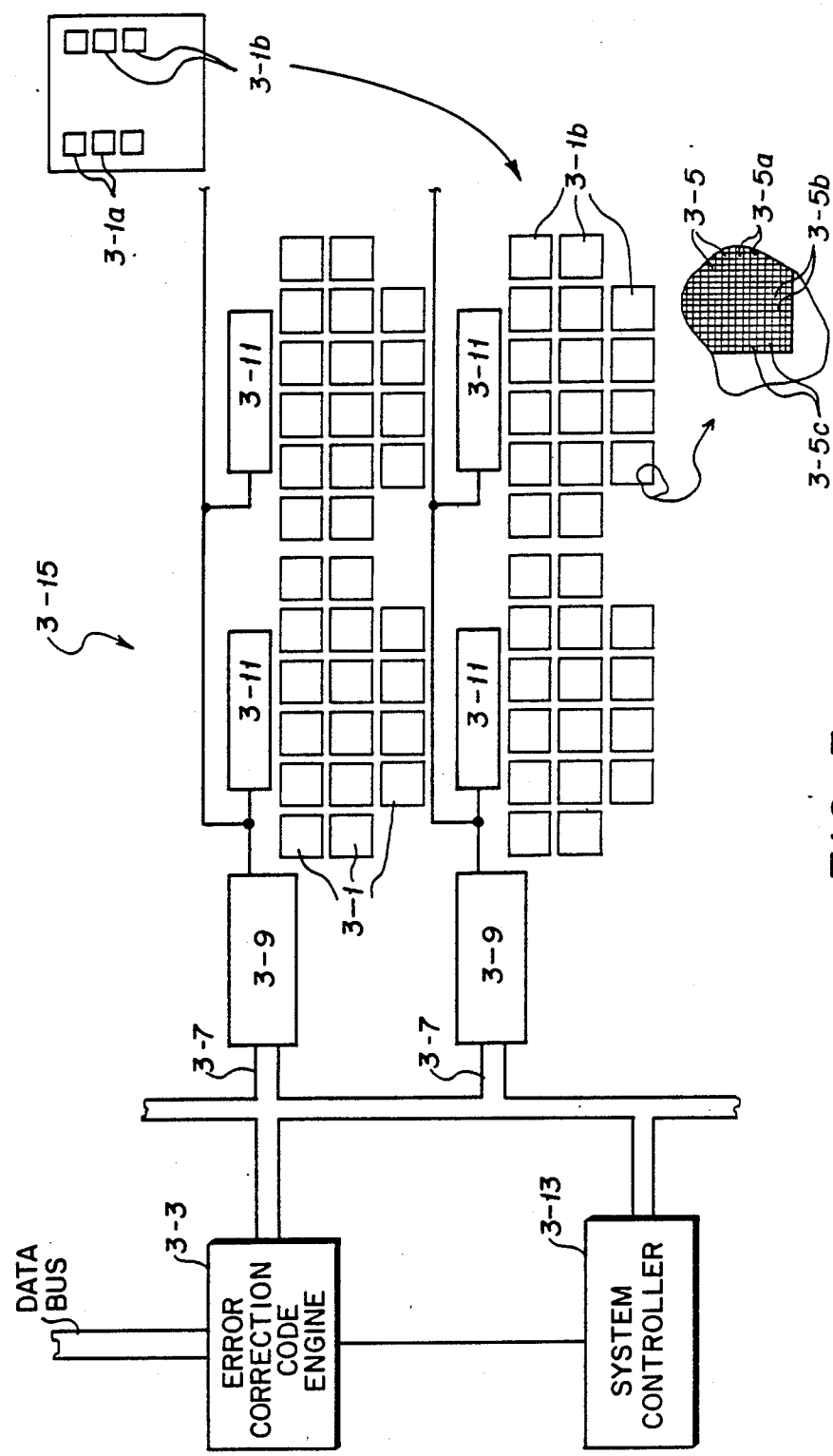
FIG. 3 shows the preferred embodiment of the self-testing and self-repairing memory system apparatus.

Broadly stated, this invention provides a defect-tolerant memory system 3-15, shown in FIG. 3.

Memory system 3-15 is formed with a plurality of memory chips 3-1. The memory chips 3-1 are formed from die that have been cut from a wafer. An abbreviated wafer probe test conducted upon the wafer detects die that have gross defects, referred to here as defective die 3-1a. Such defective die 3-1a are rejected and discarded. Die which remain after the defective die 3-1a have been discarded are those which have passed the abbreviated wafer probe test. These die are accepted and packaged to form memory chips, referred to here as acceptable memory chips 3-1b. Only acceptable memory chips 3-1b are assembled into memory system 3-15.

Memory chips 3-1 each contain a plurality of memory cells 3-5. Memory cells 3-5 are here classified according to their condition as either defective memory cells 3-5a, good memory cells 3-5b, or replacement memory cells 3-5c. Good memory cells 3-5b are those memory cells which are capable of carrying out their intended data storage function without error, while defective memory cells 3-5a do not function as intended, causing data error. Replacement memory cells 3-5c replace defective memory cells 3-5a, as described below.

Memory system 3-15 also includes testing means, such as an error correction code (ECC) engine 3-3, for detecting and correcting data errors, and as a result characterizing memory cells 3-5, including replacement memory cells 3-5c, as being either good memory cells 3-5b or defective memory cells 3-5a. Memory system 3-15 also includes means, such as a system controller 3-13, in communication with the testing means (ECC engines 3-3) to receive the characterizing result produced by the testing means, and in communication with a substitute address table 3-11 for replacing large groups of defective memory cells 3-5a with replacement memory cells 3-5c. A small number of defective memory cells 3-5a may continue to be used, relying on the ECC engine 3-3 to correct any resulting data errors.

A more detailed description of the various elements of the memory system 3-15 and its operation follows.

DETAILED DESCRIPTION OF THE PREFERRED EMBODIMENT

FIG. 3 shows the preferred embodiment of the inventive self-testing self-repairing memory system 3-15.

Memory system 3-15 contains memory integrated circuit (IC) chips 3-1 having numerous memory cells 3-5, including defective memory cells 3-5a, good memory cells 3-5b and replacement memory cells 3-5c. Memory chips 3-1 have passed an abbreviated wafer probe test, thereby establishing themselves as unlikely to have any gross defects in their circuits.

Further included is (a) a system controller 3-3 with firmware that executes self-testing and self-repairing algorithms stored in controller 3-13 as a non-volatile table, (b) substitute address table 3-11 that is rewritable and that will be used to contain the address of replacement memory cells 3-5c, (c) an address interpreter 3-9, and (d) an ECC engine 3-3 that is capable of detecting and correcting errors in the stored data, thereby characterizing memory cells 3-5 as being either defective memory cells 3-5a or good memory cells 3-5b.

The abbreviated wafer probe test detects die on a wafer requiring excessive operating current, requiring excessive standby current, or having an excessive number of defective memory cells 3-5a. These symptoms often result from defects in the power supply lines, address lines, and other gross failures. The manufacturer discards defective die 3-1a, i.e. die with gross defects and assembles acceptable memory chips 3-1b into memory systems.

In the preferred embodiment of the invention, the acceptable memory chips 3-1b are assembled into clusters. Each cluster of the memory chips 3-1 has a substitute address table 3-11.

The clusters and their associated substitute address table 3-11 are divided into different channels 3-7. Each channel 3-7 has an address interpreter 3-9. Each memory system 3-15 further includes a system controller 3-13 and an error correction code engine 3-3.

The preferred embodiment of the memory system 3-15 contains an address interpreter 3-9. The address interpreter 3-9 produces the address of replacement memory cell 3-5c found among memory cells 3-5 when presented with the address of a defective memory cell 3-5a that has been replaced. Whenever the host computer system (not shown, but connected to the data bus of FIG. 3) accesses a memory location, it sends the address to the address interpreter 3-9. The address interpreter 3-9 queries the substitute address table 3-11 to determine if that memory cell 3-5 has been replaced and to determine the address of that memory cell 3-5. The substitute address table 3-11 can have several different embodiments such as (a) a look-up table (not shown) or (b) a content-addressable memory (not shown). It can be a look-up table which contains an entry for each memory location. Each address presented to a look-up table addresses an unique entry in the look-up table. If the corresponding memory location has been replaced, the look-up table entry contains the address of the replacement memory cell 3-5c. Alternatively, the substitute address table 3-11 can have the form of a content addressable memory. When the host computer system accesses memory, the memory address presented is compared with the entries in the content addressable memory. If the desired address does not match an entry of the content addressable memory (CAM), then that particular memory location has not been replaced. If the address matches an entry of the content addressable memory, then that memory cell 3-5 is a defective memory cell 3-5a that has been replaced with a replacement memory cell 3-5c and the CAM produces the address of the replacement memory cell 3-5c.

The substitute address table 3-11 when embodied as a content addressable memory, stores pairs of addresses: the address of a group of defective memory cells 3-5a plus the address of a group of replacement memory cells 3-5c that replace the group of defective memory cells 3-5a. When the memory system 3-15 receives a request to read or write data to a group of defective memory cells 3-5a, the address interpreter 3-9 uses the substitute address table 3-11, to find the address of the group of replacement memory cells 3-5c. Then, the memory system 3-15 sends the request to the group of replacement memory cells 3-5c.

The substitute address table 3-11 is rewritable. Whenever defective memory cells 3-5 are detected, the memory system 3-15 can be repaired by updating the substitute address table 3-11 with an entry of the address of defective memory cells 3-5a and the address of the replacement memory cells 3-5c. Thus, the memory system 3-15 can repair itself at any time, either during manufacture or during normal operation.

The preferred embodiment of the memory system has an error correction code engine 3-3. The preferred embodiment of the invention uses the Reed-Solomon (255, 249) error correction code shortened to (70, 64). The error correction code breaks incoming data into records. Each record consists of 64 data bytes plus 6 bytes of check bits. From this data, the ECC engine 3-3 forms 70 symbols having 8 bits each and stores these symbols into memory. When the data is read from the memory system 3-15, it is passed through the ECC engine 3-3 which detects and corrects errors as long as the record does not contain too many defects. This particular Reed-Solomon error correction code can correct records containing fewer than four defective symbols. In order to operate the memory system 3-15 so that the combination of previously undetected defects combined with previously detected defects does not exceed the capability of the ECC engine 3-3, the preferred embodiment of the invention replaces defective memory cells 3-5a when the number of defective symbols per record exceeds one. However, the invention could be practiced with larger records and/or a different margin of safety.

Figure 1:
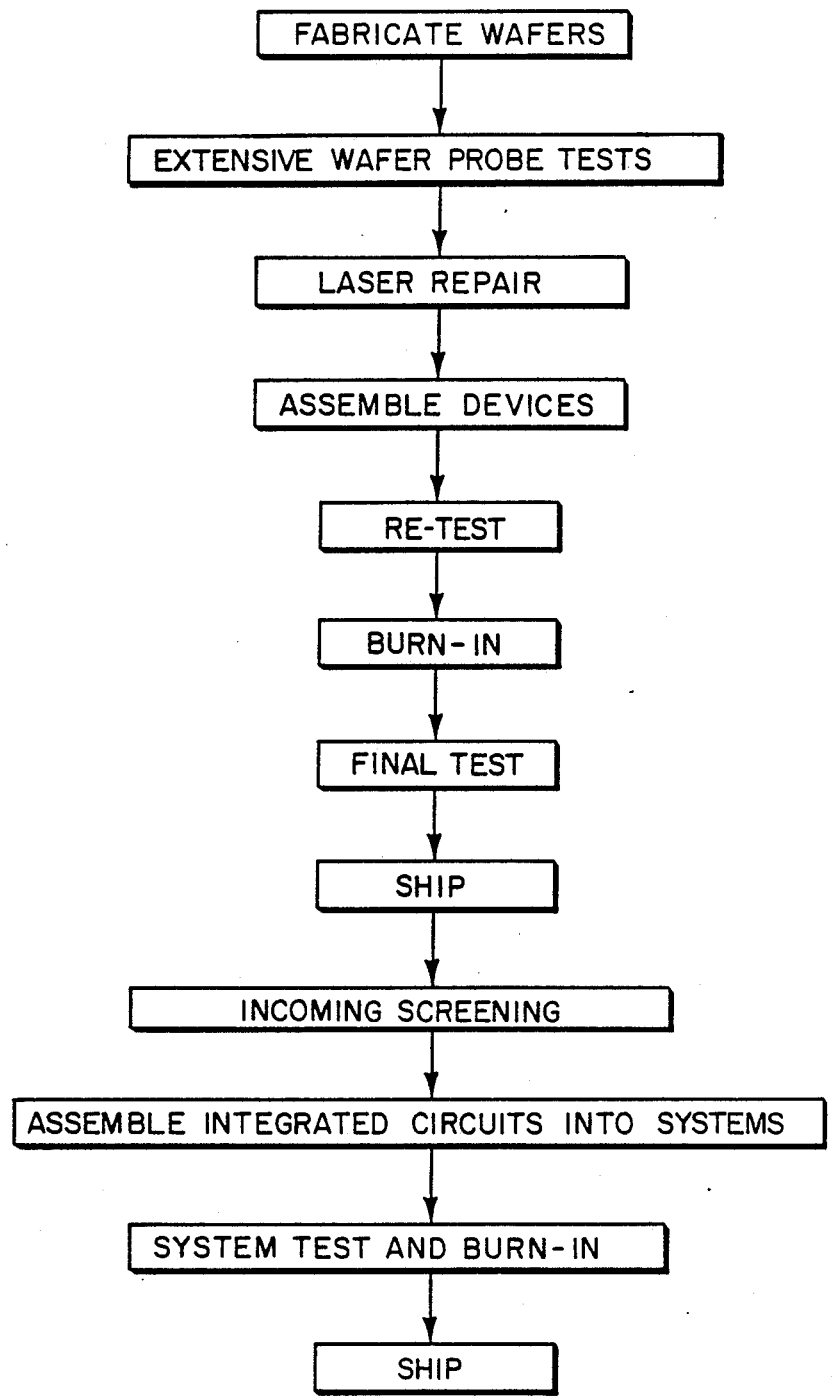
FIG. 1 shows the method for manufacturing prior art memory systems.
Figure 2:
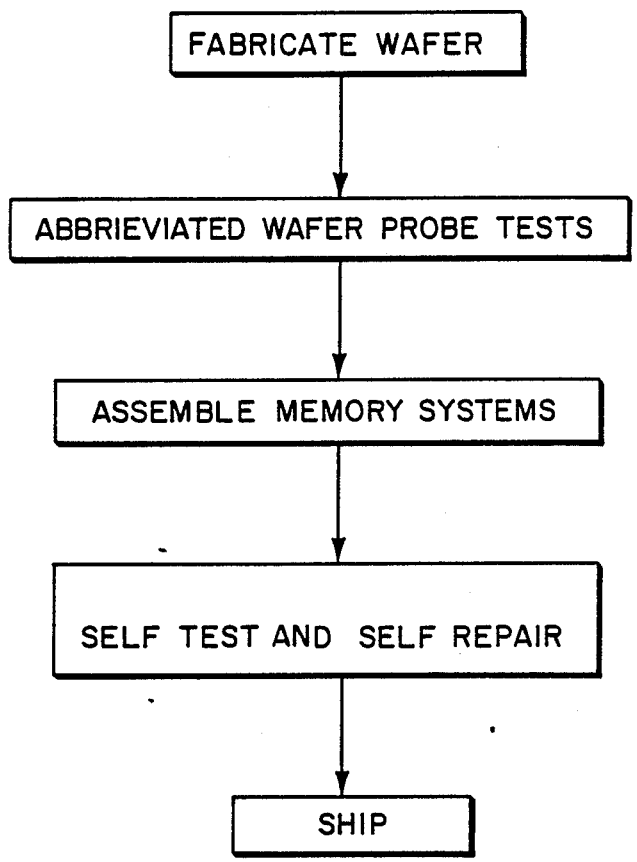
FIG. 2 shows the present invention's method for manufacturing a self-testing and self-repairing memory system.

With reference to FIGS. 2 and 3, the present invention's method of making a self-testing and self-repairing memory system 3-15 uses the memory system's abilities to test and repair itself. The method conducts an abbreviated wafer probe test upon a wafer to detect and reject defective die 3-1a that have gross defects such as excessive power supply current, defects in the address lines, power supply lines, or control logic. Unlike the prior art, the manufacturing process is then completed and the passing die are cut and packaged into acceptable memory chips 3-1b without repairing the die and without further testing. Next, the method assembles the chips into a memory system 3-15 with a system controller 3-13, substitute address table 3-11, address interpreter 3-9 and firmware to operate the system 3-15. Then, the entire memory system is subjected to burn-in tests.

Next, memory system 3-15 tests itself for defective memory cells 3-5a using firmware in the system controller 3-13. The firmware in the system controller 3-13 contains simple, short and inexpensive tests. These tests are an abbreviated version of tests conducted by conventional memory chip testers, such as a marching 1's test. The system controller 3-13 conducts these tests by writing test patterns directly to the memory cells 3-5 and reading them back again.

After conducting the initial self-test, the memory system 3-15 decides whether to replace the defective memory cells 3-5a. The system controller 3-13 determines whether to correct the records containing defective memory cells 3-5a with the error correction code engine 3-3 or to replace the records with a group of replacement memory cells 3-5c. The system controller 3-13 replaces records having more data errors than the error correction code engine 3-3 can handle with a wide margin of confidence. In the preferred embodiment, system controller 3-13 replaces defective memory cells 3-5a when the record contains more than one erroneous 8-bit symbol. The system controller 3-13 replaces these defective memory cells 3-5a in the manner stated previously. The system controller 3-13 updates the substitute address table 3-11 with the address of the defective memory cells 3-5a and the replacement memory cells 3-5c.

The self-repairing feature of the memory system in FIG. 3 allows the memory system 3-15 to delay self-testing until the memory system has been manufactured. The self-repair feature of the invention and the error correction code engine 3-3 allows the memory system 3-15 to use a simple test that allows a few defects to remain undetected and then to detect those defects during normal operation.

During normal operation, self-testing occurs under at least three conditions. In regular use, the self-testing and self-repairing memory system executes a simplified self-test with each power on. Secondly, the controlling computer system can request a self-test. Thirdly, during normal use, the self-testing and self-repairing memory system continually searches for errors by reading the data in every location at least once per day and by using the error correction code to detect errors. When an error is detected, the controller's 3-13 record of previously detected errors is consulted to determine if this is a newly detected defect. If it is a newly detected defect, the data is corrected by the ECC engine 3-3, rewritten and reread to determine if it is a hard or soft error. If it is a hard error, and the number of defective symbols in that record is still acceptable, then the corresponding group of memory cells 3-5 remains in use. However, if the number of defective symbols exceeds the criterion for acceptable ECC engine 3-3 margin, then that group of memory cells 3-5 is determined to be defective and is taken out of use. A group of replacement memory cells 3-5c are used instead; the substitute address table 3-11 is updated and the corrected data is written into the substitute location. The addresses of the group of memory cells 3-5 that contain too many defective memory cells 3-5a are stored in the substitute address table 3-11 along with the address of a group of replacement memory cells 3-5c that will be used instead.

The present invention's method of using the self-testing and self-repairing memory system 3-15 tests and repairs the system 3-15 at power on, corrects soft errors and data errors due to defective memory cells 3-5a that were not replaced by replacement memory cells 3-5c, searches for new or previously undetected errors, and records errors detected by the error correction code engine 3-3, and uses these records to estimate the memory system's 3-15 reliability.

When the power is turned on, the system 3-15 self-tests and self-repairs. The memory system 3-15 updates the substitute address table 3-11 for any groups of memory cells 3-5 that are determined to be defective. Also, it reports its usable capacity to the host computer system and answers requests for reliability data.

During normal use, when the host system requests the memory system 3-15 to write data to a particular address, the error correction code engine 3-13 encodes the data. The address interpreter 3-9 searches the substitute address table 3-11 for that address specified by the host. If the address is found, the data is written instead into the substitute address. Otherwise, the data is written into the address specified by the host. When the host requests that data be read from a particular address, again the address interpreter 3-9 causes the memory system to read from the substitute address if the address specified by the host is defective.

Those few defective memory cells 3-5a that were not detected during the self-test, whose failure depends on the pattern of data in the surrounding cells, are detected during normal use. The pattern sensitive defects are detected as errors in the data by the error correction code engine 3-3.

When the number of defective memory cells 3-5a in a group of memory cells 3-5 approaches the maximum number of defects that can be corrected by the error correction code engine 3-3, then that group of memory cells 3-5 is termed defective. When a group of memory cells 3-5 is newly termed defective, the substitute address table 3-11 is updated with the addresses of the defective group and of the group of replacement memory cells 3-5c, then the data is corrected by the error correction code engine 3-3 and restored into the group of replacement memory cells 3-5c. If the newly detected defective memory cell 3-5a does not increase the number of defects present in a group of memory cells 3-5 to the point where it approaches the ability of the error correction code engine 3-3 to correct the data, then the group of memory cells 3-5 is not termed defective and remains in use. No substitute is assigned, and the substitute address table 3-11 is not changed. The next time data is read from this group of memory cells 3-5, the defective memory cell 3-5a will be detected again and the data will be corrected by the error correction code engine 3-3.

The data that is read from either the host specified address or the substitute address is processed by the error correction engine 3-3. If errors are detected, they are corrected, and the system controller 3-13 is notified that errors have occurred. The system controller 3-13 compares the address to its record of addresses with defective memory cells 3-5a and updates this record if necessary. If the number of defective memory cells 3-5a is approaching the maximum number of errors that can be corrected by the error correction code engine 3-3, then the system controller 3-13 declares that address to be defective. It takes the corrected data, writes it into a group of replacement memory cells 3-5c at an unused address, and then adds an entry to the substitute address table 3-11.

System reliability can be estimated from the number and rate of defects that are detected while the system is in operation. Hard errors defined as permanent failures can be distinguished from transient errors (soft errors) by comparing the recent report of errors from the error correction code with the error report stored in the controller's record.

Since undetected defects are few in number, the probability that previously undetected defects might combine with previously detected defects and together exceed the maximum number of errors that the error correction code engine 3-3 can correct is extremely small. Therefore, the presence of these heretofore undetected defects, and the data errors they cause, do not cause uncorrectable errors that would cause a memory system 3-15 failure.

A second special case occurs when a record is found with an uncorrectable error in it. In that case, the system controller 3-13 would save the uncorrected data and check bits and test the offending record. If the record was found to be defective, it would be spared and the uncorrected record and the check bits would be written back into the spare. A note would be made that uncorrectable data had been intentionally stored in that location. If the controlling computer ever read that record, it would be given the uncorrected data and a flag indicating bad data.

The invention claimed is:

1. A defect-tolerant memory system, capable of performing after manufacture a plurality of periodic self-test self-repair operations on itself during continuous operational use, comprising:
   a plurality of memory chips having a plurality of memory cells including
   (1) replacement memory cells, and
   (2) an as yet uncharacterized mix of good memory cells and defective memory cells;

first means for testing and as a result characterizing each of said plurality of memory cells as being one of a plurality of good memory cells and a plurality of defective memory cells; and second means:
(i) coupled to communicate with said first means:
(1) for causing the first means to periodically test and characterize some or all of said memory cells using test data in a manner other than the storage and retrieval of actual working data; and
(2) to receive the characterizing result;
(ii) coupled to communicate with said replacement memory cells; and
(iii) capable of causing, as a result of said characterizing result, said memory system to either:
(1) continue to use one or more defective memory cells; and
(2) replace one or more defective memory cells with replacement memory cells.

2. A memory system as in claim 1, which includes only acceptable memory chips having passed a test for and thereby being known to be free of, gross defects.

3. A memory system as in claim 1 wherein said first means comprises an error correction code (ECC) engine.

4. A memory system as in claim 3 wherein said second means causes said first means to test and characterize said memory cells, using a test pattern, upon detecting an error during the storage and/or retrieval of actual working data which cannot be corrected by said error correction code engine.

5. A memory system as in claim 3 wherein said memory system continues to use one or more defective memory cells when errors caused by one or more defective memory cells can be corrected by said error correction code engine.

6. A memory system as in claim 3 wherein said memory system replaces one or more defective memory cells when errors caused by said one or more defective memory cells cannot be corrected by said error correction code engine.

7. A memory system as in claim 1 wherein said second means comprises a system controller.

8. A memory system as in claim 1, further comprising a substitute address table accessible by said second means to retrievably store an address of a defective memory cell and a related address of a replacement memory cell.

9. A memory system as in claim 1 wherein said second means causes said first means to test and characterize said memory cells, using a test pattern, upon application of power to said memory system.

10. A memory system as in claim 1 wherein said second means causes said first means to test and characterize said memory cells, using a test pattern, upon detecting an error during the storage and/or retrieval of actual working data.

11. A defect tolerant memory system, capable of performing after manufacture a plurality of periodic self-test self-repair operations on itself during continuous operational use, comprising:
a plurality of individual integrated circuit memory chips each comprising a plurality of individual memory cells, said plurality of memory chips including replacement memory cells and an as yet uncharacterized mix of:
(1) good memory cells that function as intended; and
(2) defective memory cells that do not function as intended;
first means for testing and as a result characterizing each of said plurality of individual memory cells, including said replacement memory cells, as being one of a plurality of good memory cells and a plurality of defective memory cells;
second means:
coupled to said first means for causing the first means to periodically test and characterize the memory cells using test data in a manner other than the storage and retrieval of actual working data;
coupled to the said first means to receive the result characterizing the memory cells as good memory cells and defective memory cells; and
a substitute address table accessible by said second means, said substitute address table being capable of storing an address a replacement memory cell corresponding to a defective memory cell, said second means being capable of causing, as a result of a characterizing result, said memory system to either:
(1) continue to use one or more of said defective memory cells; and
(2) to store one or more addresses of replacement memory cells in said substitute address memory so as to replace one or more defective memory cells with said replacement memory cells.

12. A memory system as in claim 11 wherein said second means causes said first means to test and characterize said memory cells, using a test pattern, upon application of power to said memory system.

13. A memory system as in claim 11 wherein said second means causes said first means to test and characterize said memory cells, using a test pattern, upon detecting an error during the storage and/or retrieval of actual working data.

14. A memory system as in claim 11 which includes only acceptable memory chips having passed a test for, and thereby being known to be free of, gross defects.

15. A memory system as in claim 11 wherein said first means comprises an error correction code (ECC) engine.

16. A memory system as in claim 15 wherein said second means causes said first means to test and characterize said memory cells, using a test pattern, upon detecting an error during the storage and/or retrieval of actual working data which cannot be corrected by said error correction code engine.

17. A memory system as in claim 15 wherein said memory system continues to use one or more defective memory cells when errors caused by said one or more defective memory cells can be corrected by said error correction code engine.

18. A memory system as in claim 15 wherein said memory system replaces one or more defective memory cells when errors caused by said one or more defective memory cells cannot be corrected by said error correction code engine.

19. A memory system as in claim 11 wherein said second means comprises a system controller.

20. A method for enabling a memory system having a plurality of memory chips, so as to self-test and self-repair after being assembled, thereby allowing the memory system to be built with less-than-defect-free memory chips, the method comprising the steps of:

(a) selecting a plurality of memory chips:
(i) known to be free of unacceptably large quantities of defects but not required to be known to be free of small quantities of defects; and
(ii) comprised of a plurality of memory cells including:
(1) a plurality of replacement memory cells; and
(2) a plurality of as yet undifferentiated good memory cells and defective memory cells;
(b) assembling the memory chips into a memory system;
(c) routinely and periodically testing the memory cells to differentiate the good memory cells and the defective memory cells using test data in a manner other than the storage and retrieval of actual working data; and
(d) selectively rendering the defective memory cells inoperable replacing defective memory cells with replacement memory cells.

21. A method as in claim 20 wherein said step of routinely and periodically testing comprises the step of causing said first means to test and characterize said memory cells, using a test pattern, upon application of power to said memory system.

22. A method as in claim 20 wherein said step of routinely and periodically testing comprises using a test pattern to detect errors during the storage and/or retrieval of said test pattern.

23. A method as in claim 20 wherein said step of routinely and periodically testing comprises the step of detecting errors with an error correction code (ECC) engine of the memory system during the storage and/or retrieval of actual working data.

* * * * *